United States Patent
Otremba

(10) Patent No.: US 11,329,000 B2
(45) Date of Patent: May 10, 2022

(54) PACKAGE FOR A MULTI-CHIP POWER SEMICONDUCTOR DEVICE

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 16/798,536

(22) Filed: Feb. 24, 2020

(65) Prior Publication Data

US 2020/0273802 A1 Aug. 27, 2020

(30) Foreign Application Priority Data

Feb. 25, 2019 (EP) ..................................... 19159051

(51) Int. Cl.
| | |
|---|---|
| H01L 23/31 | (2006.01) |
| H01L 23/538 | (2006.01) |
| H01L 21/50 | (2006.01) |
| H01L 23/42 | (2006.01) |
| H01L 25/07 | (2006.01) |
| H01L 21/60 | (2006.01) |

(52) U.S. Cl.
CPC .......... *H01L 23/5386* (2013.01); *H01L 21/50* (2013.01); *H01L 23/42* (2013.01); *H01L 23/5385* (2013.01); *H01L 25/072* (2013.01); *H01L 2021/60112* (2013.01)

(58) Field of Classification Search
None
See application file for complete search history.

(56) References Cited

U.S. PATENT DOCUMENTS

| | | | |
|---|---|---|---|
| 2004/0183188 A1 | 9/2004 | Oohama | |
| 2008/0224323 A1* | 9/2008 | Otremba | ................. H01L 24/73 257/778 |
| 2012/0326289 A1* | 12/2012 | Minamio | ............ H01L 23/3107 257/676 |

(Continued)

FOREIGN PATENT DOCUMENTS

| | | |
|---|---|---|
| DE | 102015101674 A1 | 8/2016 |
| DE | 102015120396 A1 | 6/2017 |

*Primary Examiner* — Benjamin P Sandvik
(74) *Attorney, Agent, or Firm* — Murphy, Bilak & Homiller, PLLC

(57) ABSTRACT

A package includes: a package body having an outside housing including first and second package sides and package sidewalls that extend between the first and second package sides; first and second electrically conductive interface layers spaced apart from each other at the outside housing; and first and second power semiconductor chips arranged within the package body, both chips having a respective first load terminal and a respective second load terminal. The first load terminals are electrically connected to each other within the package body. The second load terminal of the first chip is electrically connected to the first electrically conductive interface layer. The second load terminal of the second chip is electrically connected to the second electrically conductive interface layer. The outside housing of the package body further includes a creepage structure having a minimum dimension between the first electrically conductive interface layer and the second electrically conductive interface layer.

11 Claims, 5 Drawing Sheets

(56) References Cited

U.S. PATENT DOCUMENTS

| | | | |
|---|---|---|---|
| 2014/0264819 A1* | 9/2014 | Okumura | H01L 23/49562 257/712 |
| 2015/0102479 A1* | 4/2015 | Fuergut | H01L 23/3157 257/706 |
| 2015/0262903 A1 | 9/2015 | Lohia et al. | |
| 2016/0005724 A1* | 1/2016 | Takeshita | H01L 31/167 257/82 |
| 2016/0315037 A1* | 10/2016 | Kadoguchi | H01L 23/49568 |
| 2018/0019319 A1* | 1/2018 | Baburske | H01L 29/7397 |
| 2019/0378785 A1* | 12/2019 | Muto | H01L 21/565 |

\* cited by examiner

PACKAGE FOR A MULTI-CHIP POWER SEMICONDUCTOR DEVICE

TECHNICAL FIELD

This specification refers to embodiments of a package enclosing a plurality of power semiconductor chips and to embodiments of a power converter circuit and to embodiments of a method of forming a package. In particular, this specification refers to embodiments of a package including a bidirectionally conductive power semiconductor switch (BiDi Switch) comprising at least two power semiconductor chips, and to corresponding embodiments of a method and of a power convert circuit.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises one or more power semiconductor chips, each configured to conduct a load current along a load current path between two load terminals of the respective chip. Further, the load current path may be controlled, e.g., by means of an insulated electrode, sometimes referred to as gate electrode. For example, upon receiving a corresponding control signal from, e.g., a driver, the control electrode may set the power semiconductor chip in one of a conducting state and a blocking state.

After the power semiconductor chip has been manufactured, it is usually installed within in a package, e.g., in a manner that allows the package with the chip(s) to be arranged within an application, e.g., in a power converter circuit, e.g., such that the chip(s) may be coupled to a carrier, e.g., a printed circuit board (PCB), via the package.

To this end, a technology commonly referred to as surface-mount technology (SMT) is known, wherein this notion may generally refer to producing electronic circuits in which the components are mounted or placed directly onto the surface of a PCB. Such a component is hence referred to as surface-mount-device (SMD) component.

Another mounting configuration is the so-called through-hole technology, e.g., a construction method of fitting components with wire leads into holes in a circuit board.

Generally, an SMD component can be smaller than its through-hole counterpart. Nevertheless, both technologies are still used nowadays.

A package may have short pins or leads of various styles, flat contacts (also known as "terminal pads"), a matrix of solder balls (e.g., a so-called Ball Grid Array (BGA)), and/or terminations on the package body of the component.

Exemplary configurations of an SMD package are known from documents DE 10 2015 101 674 A1 and DE 10 2015 120 396 A1. Each of these SMD packages encloses a power semiconductor chip and has a package body with a package top side, a package footprint side and package sidewalls, wherein the package sidewalls extend from the package footprint side to the package top side. The chip has a first load terminal and a second load terminal and is configured to block a blocking voltage applied between said load terminals. The packages each further comprise a lead frame structure configured to electrically and mechanically couple the package to a support with the package footprint side facing to the support. The lead frame structure comprises outside terminals extending out of the package sidewall and electrically connected with the first load terminal of the chip. Further, each of the packages comprise a top layer arranged at the package top side and being electrically connected with the second load terminal of the chip.

Accordingly, each of these SMD packages known from documents DE 10 2015 101 674 A1 and DE 10 2015 120 396 A1 may exhibit a package top side that faces away from the support and that is equipped with a top layer to which a heat dissipation device, e.g., a heat sink, may be mounted. Thereby, heat can be removed away from the package that encloses the chip. Such kind of packages may hence be referred to as a SMD-Top Side Cooling (SMD-TSC) packages.

The primary function of the components fulfilling heat dissipation is to remove heat away from the package body. To this end, it is for example known to couple a heat sink to the top layer, e.g., by means of an intermediate component, such as a heat spreader. The heat sink may be electrically insulated from the top layer.

Of course, the dimension and/or configuration of the means for dissipating heat of the package correlate with the heat generated by the chip(s) that operate(s) within the package, i.e., the losses generated by the chip(s) during operation. For example, such losses occur during switching event (so-called switching losses) and during load current conduction (so-called on-state losses or static losses). Losses that may occur during constant off-state (blocking state) of the chip(s) are rather significantly lower than the switching losses and the on-state losses.

It goes without saying that low power losses caused by power semiconductor chips are generally desirable. If the power losses are small, comparatively little heat as to be dissipated and, hence, the dimension and/or configuration of the means for dissipating heat of the package can be small and/or, respectively, simple. In contrast, high amount of losses, i.e., high amount of heat require large/complex heat dissipating means.

While dissipating heat is one function of the package, the package may also have to provide for safety features, e.g., the package may have to fulfill requirements regarding, e.g., a minimum distance between high voltage contacts, and/or a creepage distance and/or a clearance distance. For example, an application in which the package shall be employed can be rated in accordance with a pollution degree. A higher pollution degree may require a greater creepage distance, for example. Such requirements may have to be reflected by the design of the package.

SUMMARY

Certain aspects of the present specification are related to embodiments of a package that includes at least two separate power semiconductor switches connected anti-serially to each other in a common-source configuration, wherein the high voltage contacts, namely the drain contacts of the switches, are both connected to a respective conductive interface layer at an outside housing of the package. Between the conductive interface layers, there is provided a creepage structure, e.g., a groove, configured to increase the creepage distance between said layers.

In accordance with a first embodiment, a package comprises: a package body with an outside housing comprising at least a first package side, a second package side and package sidewalls, the package sidewalls extending between the first package side and the second package side; a first electrically conductive interface layer and a second electrically conductive interface layer spaced apart from each other at the outside housing; a first power semiconductor chip and a second power semiconductor chip arranged within the package body, wherein both the first chip and the second chip exhibit a respective first load terminal and a respective second load terminal. The first load terminals are electrically connected to each other within the package body. The second load terminal of the first chip is electrically connected to the first electrically conductive interface layer. The second load terminal of the second chip is electrically connected to the second electrically conductive interface layer. The outside housing of the package body further comprises a creepage structure with a minimum dimension between the first electrically conductive interface layer and the second electrically conductive interface layer.

In accordance with a second embodiment, a power converter circuit comprises a plurality of power semiconductor switches and is configured to convert an input power signal into an output power signal by means of operating the plurality of power semiconductor switches. At least two of the power semiconductor switches are arranged in a package in accordance with the first embodiment.

In accordance with a further embodiment, a method of forming a package is provided. The method includes providing of: a package body with an outside housing comprising at least a first package side, a second package side and package sidewalls, the package sidewalls extending between the first package side and the second package side; a first electrically conductive interface layer and a second electrically conductive interface layer spaced apart from each other at the outside housing; a first power semiconductor chip and a second power semiconductor chip arranged within the package body, wherein both the first chip and the second chip exhibit a respective first load terminal and a respective second load terminal. The first load terminals are electrically connected to each other within the package body. The second load terminal of the first chip is electrically connected to the first electrically conductive interface layer. The second load terminal of the second chip is electrically connected to the second electrically conductive interface layer. The method further comprises: Forming, at the outside housing of the package body, a creepage structure with a minimum dimension between the first electrically conductive interface layer and the second electrically conductive interface layer.

Features of optional further embodiments are defined in the dependent claims. These features may be combined with each other for forming yet further embodiments, if not explicitly stated otherwise.

BRIEF DESCRIPTION OF THE DRAWINGS

The parts in the figures are not necessarily to scale, instead emphasis is being placed upon illustrating principles of the invention. Moreover, in the figures reference numerals may designate corresponding parts. In the drawings.

DETAILED DESCRIPTION

Figure 1:
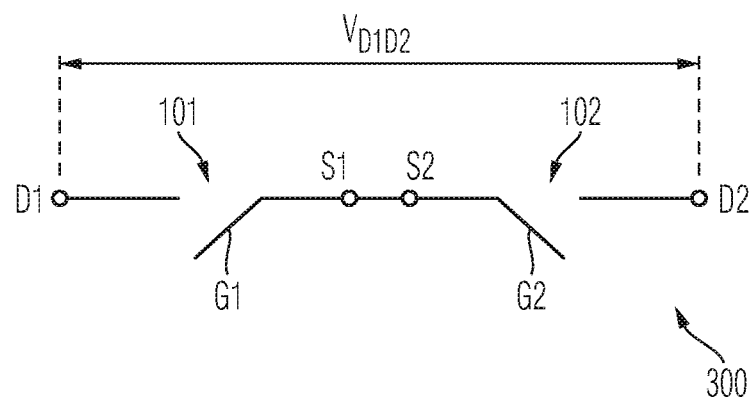
FIG. 1 schematically and exemplarily illustrates two power semiconductor chips connected anti-serially with each other in a common source configuration in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device, e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor chip, e.g., a power semiconductor chip that may be used within a power converter or a power supply. Thus, in an embodiment, such chip can be configured to carry a load current that is to be fed to a load and/or, respectively, that is provided by a power source. For example, the chip may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the chip.

The term "power semiconductor chip" as used in this specification intends to describe a single chip with high voltage blocking and/or high current-carrying capabilities. In other words, such power semiconductor chip is intended for high current, typically in the Ampere range, e.g., up to 5 or 100 Amperes or even up to 1.000 A and above, and/or voltages typically above 15 V, more typically up to 40 V, and above, e.g., up to at least 500 V or more than 500 V, e.g. at least 600 V, or even up to 2.000 V and above.

For example, the power semiconductor chip described below may be a chip that is configured to be employed as a power component in a low-, medium- and/or high voltage application. For example, the term "power semiconductor chip" as used in this specification is not directed to logic semiconductor devices that are used for, e.g., storing data, computing data and/or other types of semiconductor based data processing.

Figure 4:
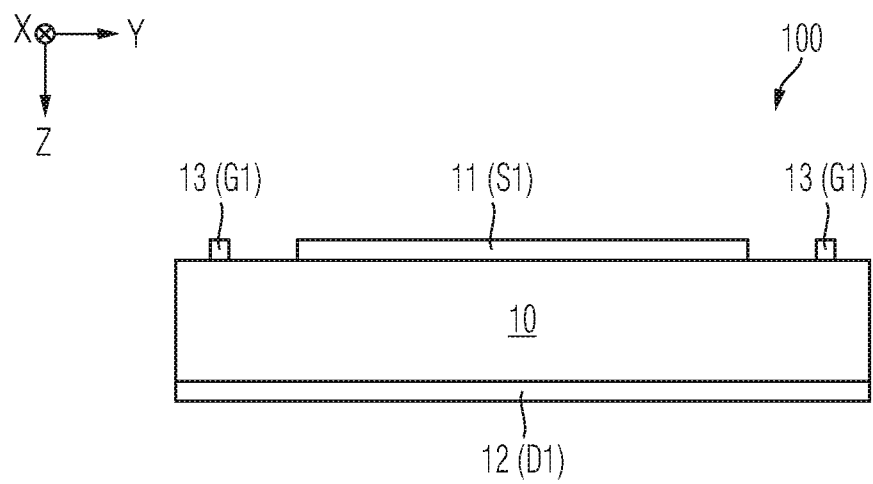
FIG. 4 schematically and exemplarily illustrates a section of a vertical cross-section of a power semiconductor chip in accordance with one or more embodiments.

FIG. 4 schematically and exemplarily illustrates a section of a vertical cross-section of a power semiconductor chip 100 in accordance with one or more embodiments. The power semiconductor chip 100 has a first load terminal 11 (S1) and a second load terminal 12 (D1). The power semiconductor chip 100 further comprises a semiconductor body 10 and is configured to block a blocking voltage applied between said load terminals 11, 12 and to conduct a chip load current between said load terminals 11, 12.

The power semiconductor chip 100 may have been processed, together with other power semiconductor chips, within a semiconductor wafer which has been diced into the individual power semiconductor chips after completion of the wafer processing. For example, during such wafer processing, the first load terminal 11 is formed for each designated chip, e.g., by depositing an electrically conductive material, e.g. a metal, on a frontside of the wafer. Forming the first load terminals 11 on the frontside of the wafer may include using a mask. The first load terminals 11 are typically formed after the configuration of the semiconductor body 10 is finished.

The second terminal 12 is typically formed on a backside of the wafer, e.g., without a mask but substantially homogeneously along the entire backside.

For example, the second load terminal 12 may include a chip backside metallization. The first load terminal 12 may comprise a chip frontside metallization, wherein the chip frontside can be structured, e.g., in that the chip frontside is also equipped with further terminals (e.g., with a control terminal and/or a sense terminal).

Hence, the chip 101 can have a vertical configuration, according to which the first load terminal 11 is arranged at the chip frontside and the second load terminal 12 is arranged at a chip backside. In lateral directions, e.g., in the lateral directions X and Y and linear combinations thereof, the chip may be terminated by a chip edge, e.g., a side surface extending in the vertical direction Z.

The semiconductor body 10 is coupled between the first load terminal 11 and the second load terminal 12. For example, if a voltage applied between the first load terminal 11 and the second load terminal 12 is positive (e.g., the electrical potential of the second load terminal 12 being greater than the electrical potential of the first load terminal 11), the semiconductor body 10 conducts the chip load current between the load terminals 11 and 12. If the voltage is negative, the semiconductor body 10 may be configured to block such voltage and inhibit a flow of the chip load current between the load terminals 11, 12.

For example, the power semiconductor chip 100 may be a diode, wherein, for example, the first load terminal 11 can be a cathode terminal and the second load terminal 12 can be an anode terminal.

In another embodiment, the power semiconductor chip 100 can be a controllable power semiconductor chip, such as a transistor (switch) or a gated diode or a thyristor or a derivative of one of the aforementioned variants. For example, the power semiconductor chip 100 may comprise a control terminal 13 (G1), which is typically arranged also at the frontside of the power semiconductor chip 101. In an embodiment, the first load terminal 11 may hence be a source/emitter terminal (S1), and the second load terminal 12 may be a drain/collector terminal (D1).

The possible basic configurations of the power semiconductor chip 100 (transistor (e.g., MOSFET, IGBT etc.), diode and thyristor) are known to the skilled person and, hence, it is refrained from explaining these in more detail. Embodiments described herein are not limited to a specific type of a power semiconductor chip. For example, each of the chips described herein can be a Si-MOSFET, a SiC-WBG (wide-band-gap) transistor or a GaN-HEMT (high-electron-mobility transistor).

Further, it shall be noted that (in a non-illustrated embodiment) the first load terminal 11 could also be arranged at the backside of the power semiconductor chip 101, and that the second load terminal 12 could also be arranged at the frontside of the power semiconductor chip 101. However, the embodiments illustrated rather relate to the scenario where the first load terminal 11, e.g., source S1, is located at the structured chip frontside, and where the second load terminal 12, e.g., drain D1, is located at the unstructured chip backside.

Before being able to be employed within an application, the power semiconductor chip 100 is usually included within a package that may allow mechanically mounting and electrically connecting the chip within the application, e.g., also for heat distribution purposes. Such package may environmentally seal the included power semiconductor chip 101.

The package described herein is configured to include at least two separate power semiconductor chips. With reference to FIG. 1, the package described herein may include a first power semiconductor chip 101 and a second power semiconductor chip 102. Both the first power semiconductor chip 101 and the second power semiconductor chip 102 may exhibit a configuration as exemplarily explained with respect to FIG. 4.

In an embodiment, both the first power semiconductor chip 101 and the second power semiconductor chip 102 may exhibit the same configuration. For example, both the first power semiconductor chip 101 and the second power semiconductor chip 102 may be a MOSFET, or both the first power semiconductor chip 101 and the second power semiconductor chip 102 may be an IGBT.

In an embodiment, the package—which will be described in more detail with respect to, e.g., FIG. 2—comprises both the first power semiconductor chip 101 and the second power semiconductor chip 102, wherein the first power semiconductor chip 101 and the second power semiconductor chip 102 maybe arranged within the package 200 in a configuration as illustrated in FIG. 1. That is, the first load terminals 11 of the chips 101 and 102, i.e., source terminal S1 and source terminal S2, may be electrically connected with each other, and the second load terminals 12 of the chips 101 and 102, i.e., the drain terminal D1 and D2, may be electrically insulated from each other. The control terminals 13, i.e., gate terminals G1 and G2, may be electrically connected with each other or may be electrically insulated from each other.

The so connected chips 101 and 102 may form a power semiconductor device 300. For example, the power semiconductor device 300 may be a bidirectionally conductive power semiconductor switch ("BiDi switch"). The total device load current may be identical to the respective chip load currents, wherein, during one current direction, either chip 101 or chip 102 is operated in a transistor mode, and the other chip is operated in diode mode (by means, e.g., of an intrinsic anti-parallel diode). In the other current direction, the roles are changed.

In another (non-illustrated) embodiment, the chips 101 and 102 may also be connected serially with each other (S1-D2-S2-D2). In an embodiment, the chips 101 and 102 are not connected in parallel to each other, but either serially or anti-serially (as shown in FIG. 1) with each other.

Figure 2:
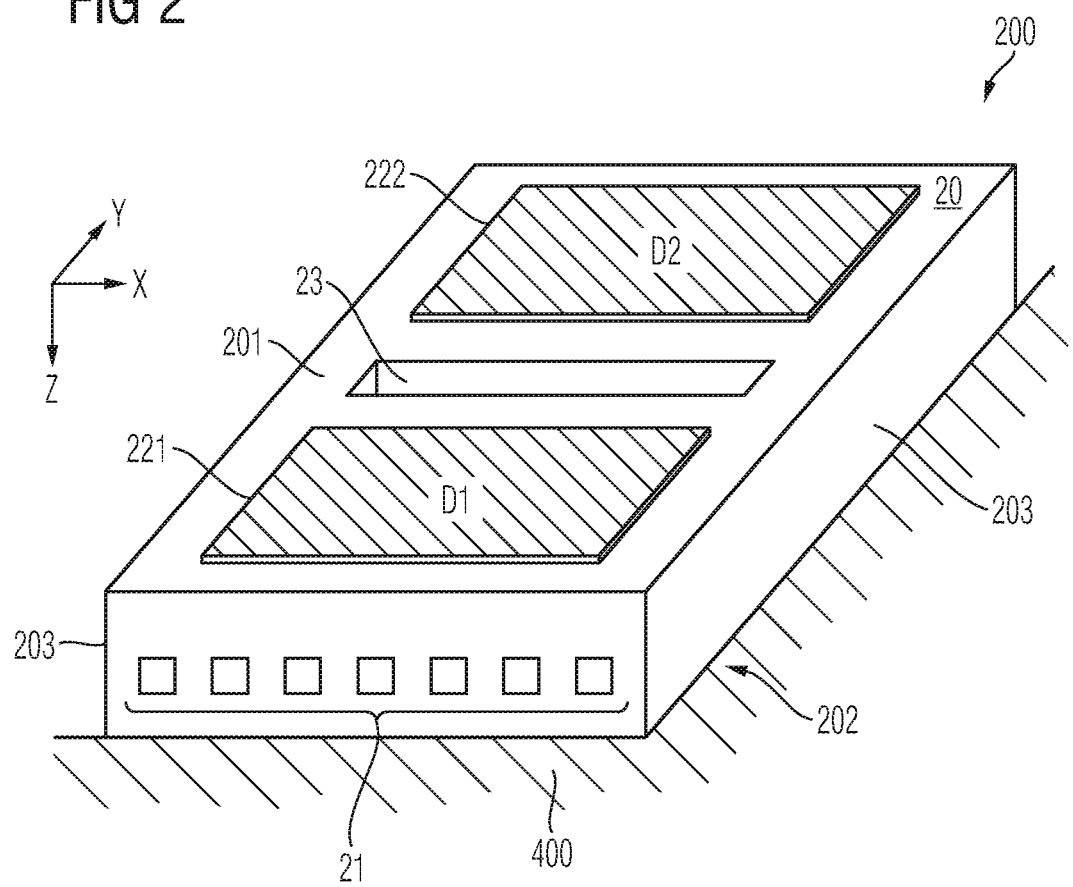
FIG. 2 schematically and exemplarily illustrates a section of a perspective projection of a package in accordance with one or more embodiments.

FIG. 2 schematically and exemplarily illustrates a section of a perspective projection of a package 200 in accordance with one or more embodiments.

The package 200 comprises a package body 20 with an outside housing comprising at least a first package side 201, a second package side 202 and package sidewalls 203, the package sidewalls 203 extending between the first package side 201 and the second package side 202. The first package side 201 can be a package top side, and the second package side can be a package footprint side 202.

The package body 20 can be made of or, respectively, comprise a molding mass. For example, the package body 20 exhibits a flat configuration, according to which: both the first package side 201 and the second package side 202 extend substantially horizontally along the first and second lateral directions X and Y; the package sidewalls 203 extend substantially vertically along the vertical direction Z; and a maximum horizontal extension of the second package side 202 amounts to at least twice of a maximum vertical extension of the package sidewalls 203.

In an embodiment, a (non-illustrated) lead frame structure of the package 200 can be configured to electrically and mechanically couple the package 200 to a carrier 400, e.g., with the second package side 202 facing to the carrier 400.

The carrier 400 may be a printed circuit-board (PCB) or may be a component of a PCB. In another embodiment, the carrier 400 may be a Direct Copper Bond (DCB) substrate, e.g. a ceramic circuit board, or may be a component of a DCB substrate. In yet another embodiment, the carrier 400 may also be based on an Insulated Metallic Substrate (IMS). The carrier 400 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

The package 200 has a first electrically conductive interface layer 221 and a second electrically conductive interface layer 222 spaced apart from each other at the outside housing, e.g., at the first package side 101, which may be the package top side. For example, the sum of the total areas of the first electrically conductive interface layer 221 and the second electrically conductive interface layer 222 amount to at least 50% or even more than 50%, e.g., up to 90% or even more of the total area of the first package side 201. Hence, the package 200 may exhibit a top side cooling (TSC) configuration.

The first electrically conductive interface layer 221 and the second electrically conductive interface layer 222 are spaced apart from each other such that they may exhibit different electrical potentials. For example, the package 200 houses the power semiconductor device 300, and the high voltage contacts (e.g., D1 and D2, cf. FIG. 1) of the power semiconductor device 300 can be contacted by means of the first electrically conductive interface layer 221 and the second electrically conductive interface layer 222. Hence, the blocking voltage ($V_{D1D2}$, cf. FIG. 1) of the power semiconductor device 300 may be present between the first electrically conductive interface layer 221 and the second electrically conductive interface layer 222.

The package 200 further includes the first power semiconductor chip 101 and the second power semiconductor chip 102 arranged within the package body 20. As explained above, both chips 101 and 102 may exhibit a configuration as exemplarily explained with respect to FIG. 4. Thus, both the first chip 101 and the second chip 102 exhibit a respective first load terminal S1, S2 and a respective second load terminal D1, D2.

The first load terminals S1, S2 are electrically connected to each other within the package body 20, e.g., in a manner as explained with respect to FIG. 1, that is, in a so-called common source configuration.

The second load terminal D1 of the first chip 101 is electrically connected to the first electrically conductive interface layer 221. For example, the electrical potential of the first electrically conductive interface layer 221 is identical to the electrical potential of the second load terminal D1 of the first chip 101.

The second load terminal D2 of the second chip 102 is electrically connected to the second electrically conductive interface layer 222. For example, the electrical potential of the second electrically conductive interface layer 222 is identical to the electrical potential of the second load terminal D2 of the second chip 102.

Figure 3:
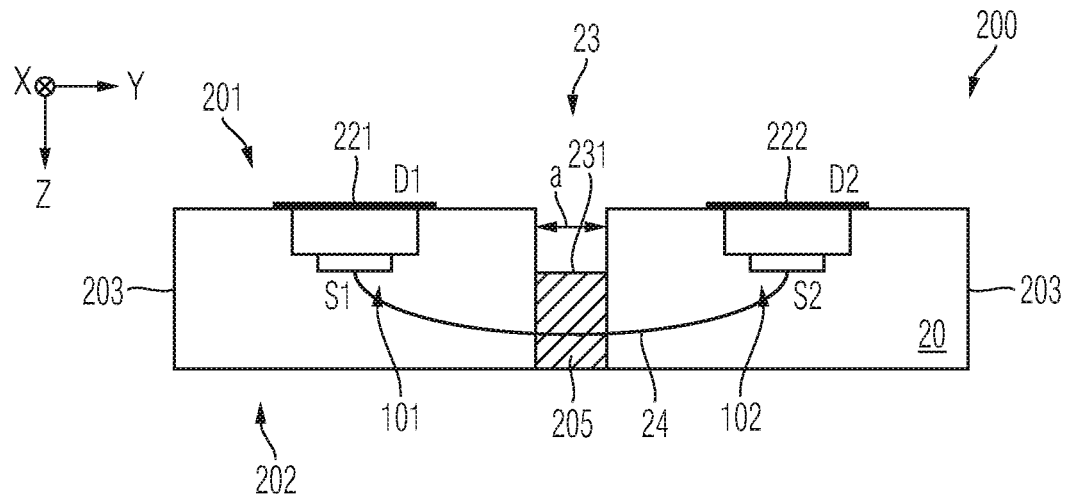
FIG. 3 schematically and exemplarily illustrates a section of a vertical cross-section of a package in accordance with one or more embodiments.

For example, the chips 101 and 102 are sandwiched in between the first package side 201 and the second package side 202 (cf. FIG. 3). The package body 20 may entirely surround the chips 101 and 102 and seal the chips 101 and 102 against the environment.

In order to provide also an interface for the control terminals 13 (G1, G2) and/or the first load terminals 11 (S1, S2) (and/or further chip terminals, such as sense terminals), the package 200 may include a plurality of outside terminals 21, as schematically illustrated in FIG. 2. These outside terminals 21 may be configured in a typical manner, e.g., as wire/pin contacts, or as flat contacts. At least some of the outside terminals 21 may form a part of the lead frame structure of the package 200, or may at least be electrically connected thereto.

Figure 5:
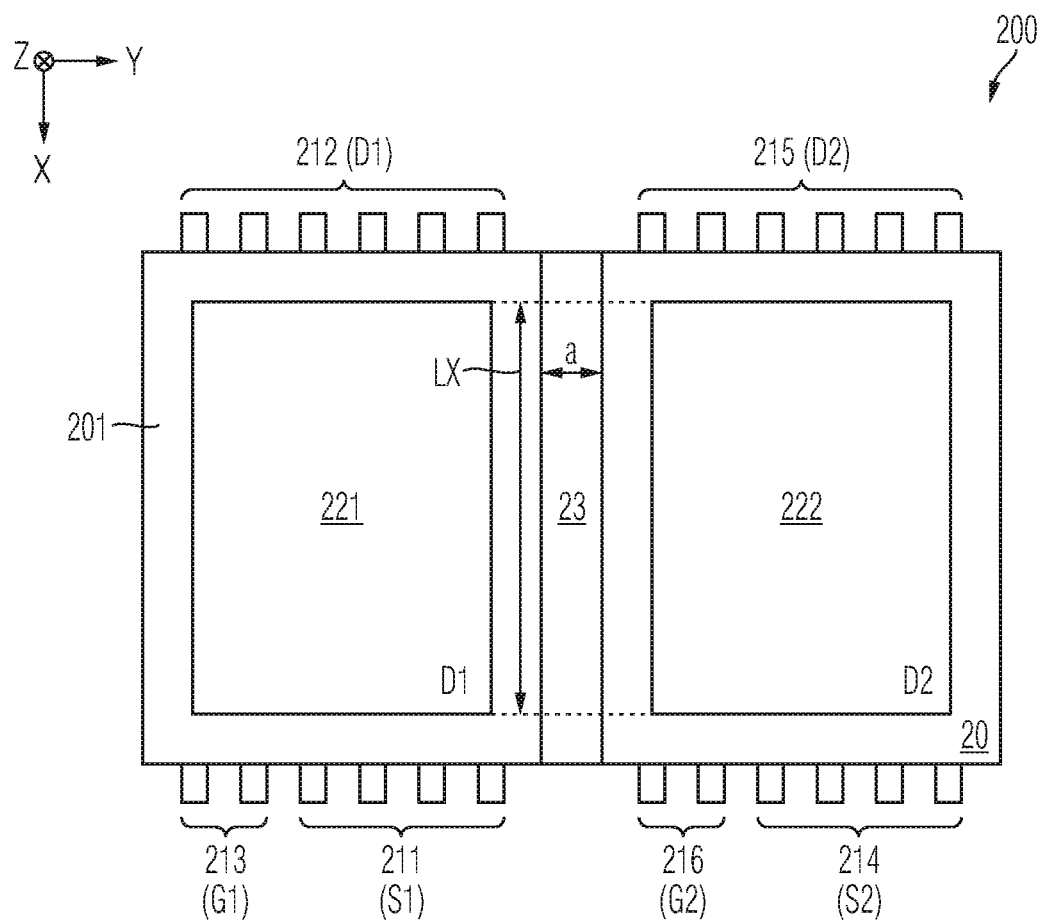
FIG. 5 schematically and exemplarily illustrates a section of a horizontal projection of a package in accordance with one or more embodiments.

For example, referring to FIG. 5, one of more first outside terminals 211 may be electrically connected to the first load terminal (S1) of the first chip 101, one of more second outside terminals 212 may be electrically connected to the second load terminal (D1) of the first chip 101, and one of more third outside terminals 213 may be electrically connected to the control terminal (G1, if present) of the first chip 101. Analogously, one of more fourth outside terminals 214 may be electrically connected to the first load terminal (S2) of the second chip 102, one of more fifth outside terminals 215 may be electrically connected to the second load terminal (D2) of the second chip 102, and one of more sixth outside terminals 216 may be electrically connected to the control terminal (G2, if present) of the second chip 102. In view of the aforesaid, the first and the fourth outside terminals 211 and 214 may exhibit the same electrical potential.

Possible designs of the outside terminals 21 are principally known to the skilled person, and herein, the design of the outside terminals 21 is of minor significance, emphasis being placed rather on the interface layers 221 and 222, as will be become apparent from the following description.

In the following description, reference is made to each of FIG. 2, FIG. 3 and FIG. 5.

In an embodiment, the outside housing of the package body 20 further comprises a creepage structure 23 with a minimum dimension a between the first electrically conductive interface layer 221 and the second electrically conductive interface layer 222.

The minimum dimension a may amount to at least 0.25 mm, or to at least 0.5 mm, or to at least 1 mm, or to at least 1.5 mm. In an embodiment, the minimum dimension is chosen in dependence of a pollution degree of the application in which the package 200 shall be employed. For example, a pollution degree of 1 may require a minimum dimension a of at least 0.25 mm. A pollution degree of 2 may require a minimum dimension a of at least 1 mm. A pollution degree of 3 may require a minimum dimension a of at least 1.5 mm.

In an embodiment, the creepage structure 23 comprises at least one of a groove and a protrusion between the first electrically conductive interface layer 221 and the second electrically conductive interface layer 222. For example, the creepage structure 23 is a groove.

Generally, in all embodiments described herein, the creepage structure 23 can be configured to increase a creepage distance between the first electrically conductive interface layer 221 and the second electrically conductive interface layer 222. The increase of the creepage distance may be referred to a scenario where the outside housing of the package body 20 would not comprise a creepage structure, e.g., where the outside housing of the package body 20 would be designed planar in the section between the first electrically conductive interface layer 221 and the second electrically conductive interface layer 222.

For example, both the first electrically conductive interface layer 221 and the second electrically conductive interface layer 222 are arranged at the first package side 201. As indicated earlier, the first package side 201 may be the package top side (i.e., the side of the package 200 facing away from the carrier 400. Both the first electrically conductive interface layer 221 and the second electrically conductive interface layer 222 can be arranged at the same horizontal level (cf. FIGS. 2 and 3) and/or may both exhibit the same total area (cf. FIGS. 2 and 5).

Further, as best illustrated in FIG. 5, the first electrically conductive interface layer 221 and the second electrically conductive interface layer 222 can exhibit a common lateral extension range Lx along the first lateral direction X, wherein the creepage structure 23 is arranged between the interface layers 221, 222 along the second lateral direction Y perpendicular to the first lateral direction X, and wherein the creepage structure 23 has a length along the first lateral direction X amounting to at least the common lateral extension range Lx. Thereby, it can be ensured that any direct path along the outside housing between the first electrically conductive interface layer 221 and the second electrically conductive interface layer 222 includes a path section along the creepage structure 23.

For example, as best illustrated in FIGS. 2 and 5, the minimum dimension a is a width of the creepage structure 23 along the second lateral direction Y, and the creepage structure 23 exhibits the minimum dimension a along the first lateral direction X for a distance amounting to at least the common lateral extension range Lx. Thereby, it can be ensured that any direct path along the outside housing between the first electrically conductive interface layer 221 and the second electrically conductive interface layer 222 includes a path section amounting to at least the minimum distance a along the creepage structure 23.

Now referring in particular to FIG. 3, the creepage structure 23 may have a total vertical dimension b along the vertical direction Z amounting to at least the minimum dimension a. In case the creepage structure 23 is a groove, the total vertical dimension b can be considered has the depth of the creepage structure 23. In case the creepage structure 23 is a protrusion, the total vertical dimension b can be considered has the height of the creepage structure 23.

In an embodiment, e.g., as schematically and exemplarily illustrated in FIG. 3, the package 200 further comprises an electrically conductive connector 24 in the package body 20, wherein the first load terminals S1, S2 of the chips 101, 102 are electrically connected to each other at least by means of the electrically conductive connector 24, and wherein the electrically conductive connector 24 laterally overlaps with the creepage structure 23. That is, the at least two chips 101 and 102 spaced apart from each other may be electrically connected to each other within the package body 20, e.g., in a common-source configuration. In other embodiments, the at least two chips 101 and 102 may be electrically connected to each other within the package body 20 in a different manner, e.g., serially (D1-S1-D2-S2). In the latter exemplary case, the first electrically conductive interface layer 221 would be connected to the drain terminal D1 of the first chip 101, the second conductive interface layer 222 would be connected to the source terminal S2 of the second chip 102. Irrespective in which configuration the chips 101 and 102 are internally connected with each other, said electrically conductive connector 24 may laterally overlap with the creepage structure 23, e.g., by extending below the bottom of the creepage structure 23.

For example, still referring to FIG. 3, the creepage structure 23 is a groove and vertically extends from the first package side 201 to the second package side 202, wherein the electrically conductive connector 24 extends through a passage 205 of the package body 20, said passage 205 being formed by a section of the package body 20 between the bottom 231 of the creepage structure 23 and the second package side 202.

The electrically conductive connector 24 can comprise at least one of a bond wire, a ribbon and a clip, wherein the electrically conductive connector 24 can have a diameter in the range of 10 µm to 1000 µm. For example, the electrically conductive connector 24 is one of a bond wire, a ribbon or a clip, and has a diameter in the range of 10 µm to 1000 µm.

Now referring to all embodiments, it is possible that the creepage structure 23 has a surface characteristic different from a surface characteristic of the remaining portion of the outside housing of the package body 20. For example, the creepage structure 23 may be equipped with a (non-illustrated) water-repellent layer or is in another or additional manner improved, e.g., by exhibiting a higher chemical stability and or other higher quality character with regards to fulfilling its function of providing a reliable creepage distance increasing element (e.g., as a protrusion, e.g., mold protrusion, and/or a groove) between the interface layers 221 and 222.

Figure 6:
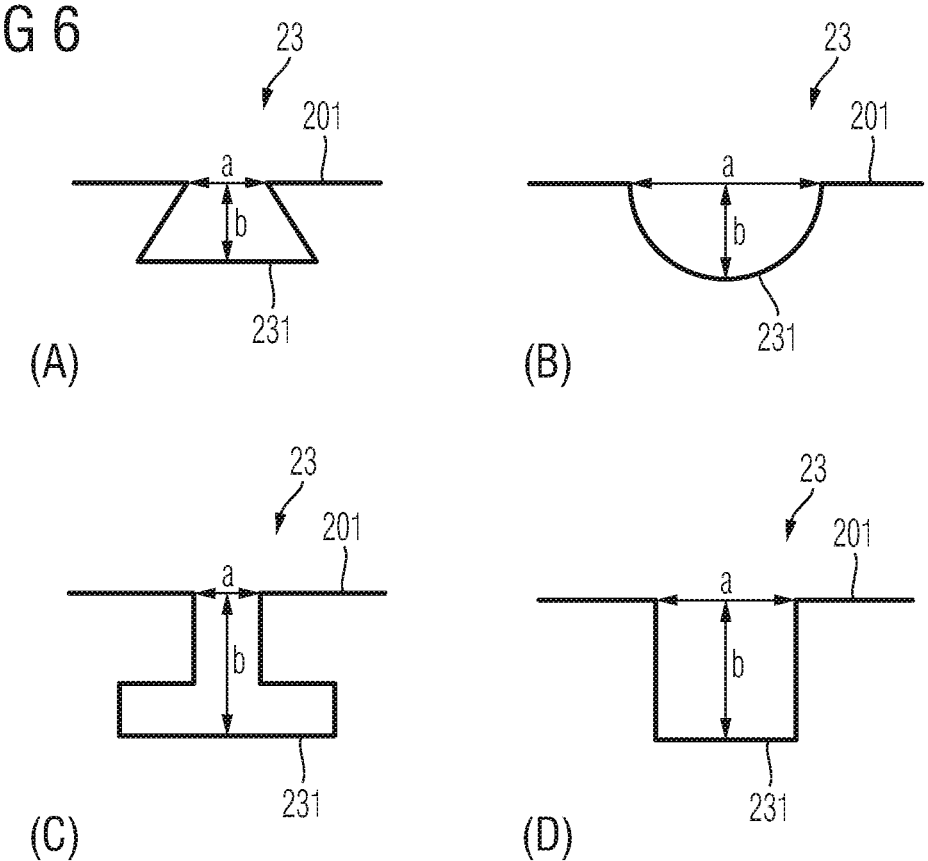
FIG. 6 schematically and exemplarily illustrates sections of a vertical cross-section of a creepage feature of a package in accordance with some embodiments.
Figure 7:
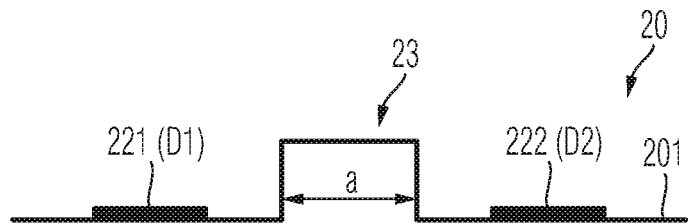
FIG. 7 schematically and exemplarily illustrates a section of a vertical cross-section of a creepage feature of a package in accordance with one or more embodiments.

Regarding possible designs of the creepage structure 23, it is referred to FIGS. 6 and 7. In accordance with variant (D) of FIG. 6, the creepage structure 23 may be a groove having a substantially rectangular cross-section. For example, such groove can be obtained by correspondingly sawing and/or milling the package body 20. In accordance with variant (B) of FIG. 6, the creepage structure 23 may be a groove having a substantially half-circular (or, respectively, a half-ellipsoidal) cross-section. For example, such groove can also be obtained by correspondingly sawing and/or milling the package body 20. In accordance with variant (A) of FIG. 6, the creepage structure 23 may be a groove having a substantially trapezoidal cross-section. For example, such groove can be obtained by correspondingly etching the package body 20. In accordance with variant (C) of FIG. 6, the creepage structure 23 may be a groove having a substantially T-like cross-section. For example, such groove can also be obtained by correspondingly etching, sawing and/or milling the package body 20. It goes without saying that, depending on the process of forming the creepage structure, the cross-sections illustrated in variant (A), (C) and (D) of FIG. 6 may have rounded corners.

Also, even though most of the present description is related to the creepage feature 23 in the form of a groove, the creepage distance increasing effect may equally be obtained by a creepage feature in the form of a protrusion, as illustrated in FIG. 7. Also such a protrusion may be designed with a cross-section corresponding to those shown in FIG. 6.

Furthermore, the creepage feature 23 may also be formed by means of a combination of one or more grooves and one or more protrusions.

Figure 8:
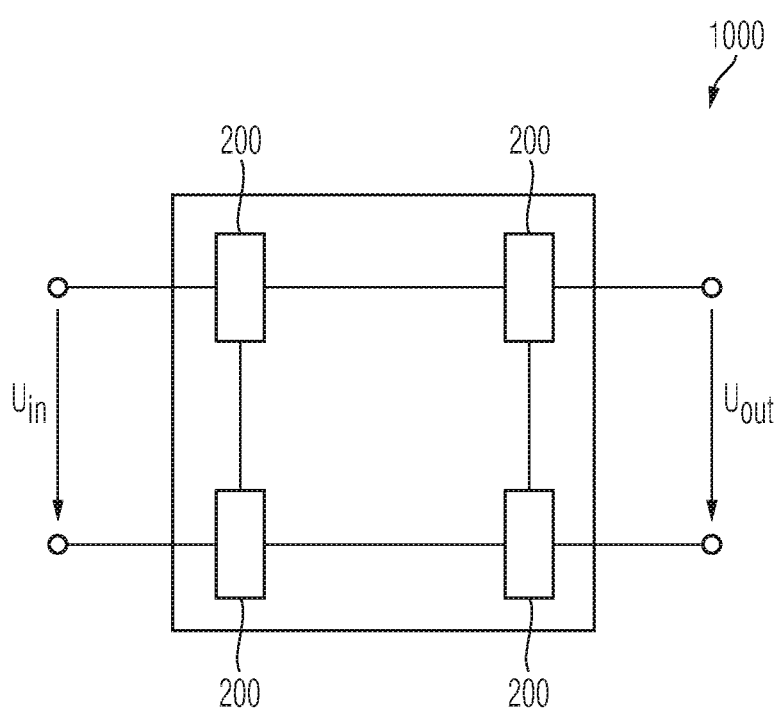
FIG. 8 schematically and exemplarily illustrates a power converter circuit in accordance with some embodiments.

Now referring to FIG. 8, a power converter circuit 1000 is presented. The power converter circuit 1000 comprises a plurality of power semiconductor switches, e.g., each exhibiting a configuration as explained with respect to FIG. 4, and is configured to convert an input power signal Uin into an output power signal Uout by means of operating the plurality of power semiconductor switches. For example, the power converter circuit 1000 can be an inverter that converts the input power signal Uin (e.g., a DC signal) into the output power signal Uout (e.g., an AC signal). The power converter circuit 1000 is not limited to any particular design. The power converter circuit 1000 can be, for example, one of a single phase inverter, a multiphase inverter, a single level inverter, a multilevel inverter, a buck-boost-converter, a boost converter, a buck converter or the like.

At least two of the power semiconductor switches are arranged in a package 200 in accordance with one or more of the above described embodiments. For example, said at least two of the power semiconductor switches are connected to each other in accordance with the example shown in FIG. 1, i.e., in a common-source arrangement.

Whereas FIG. 8 shows the power converter circuit 1000 with four packages 200, it shall be understood that in other embodiments, the power converter circuit may for example only comprise one, two or three packages 200, or more than four packages 200.

Herein presented is also a method of forming a package. The method includes providing:
  a package body with an outside housing comprising at least a first package side, a second package side and package sidewalls, the package sidewalls extending between the first package side and the second package side;
  a first electrically conductive interface layer and a second electrically conductive interface layer spaced apart from each other at the outside housing;
  a first power semiconductor chip and a second power semiconductor chip arranged within the package body, wherein both the first chip and the second chip exhibit a respective first load terminal and a respective second load terminal, and wherein
  the first load terminals are electrically connected to each other within the package body
  the second load terminal of the first chip is electrically connected to the first electrically conductive interface layer.
  the second load terminal of the second chip is electrically connected to the second electrically conductive interface layer.

The method further comprises: Forming, at the outside housing of the package body, a creepage structure with a minimum dimension between the first electrically conductive interface layer and the second electrically conductive interface layer.

Exemplary embodiments of the processing method correspond to the embodiments of the package 200 described above.

For example, providing the creepage structure 23 may comprise a package body removal step, e.g., at least one of a laser processing step, an etch processing step, a saw processing step, and a mill processing step.

Instead of such package body removal step or in addition to such package body removal step, the creepage structure may also be formed in-situ, e.g., structuring a molding process, e.g., using a mask such that less molding mass is deposited in an area between the (designated) first and second electrically conductive interface layer.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A package, comprising:
  a package body with an outside housing comprising a first package side, a second package side and package sidewalls, the package sidewalls extending between the first package side and the second package side;
  a first electrically conductive interface layer and a second electrically conductive interface layer spaced apart from each other at the outside housing;
  a first power semiconductor chip and a second power semiconductor chip arranged within the package body, wherein the first chip and the second chip each have a respective first load terminal and a respective second load terminal,
  wherein the first load terminals are electrically connected to each other within the package body,
  wherein the second load terminal of the first power semiconductor chip is electrically connected to the first electrically conductive interface layer,
  wherein the second load terminal of the second power semiconductor chip is electrically connected to the second electrically conductive interface layer,
  wherein the outside housing of the package body further comprises a creepage structure having a minimum dimension between the first electrically conductive interface layer and the second electrically conductive interface layer,
  wherein the package further comprises an electrically conductive connector in the package body, wherein the first load terminals are electrically connected to each other at least by the electrically conductive connector, and wherein the electrically conductive connector laterally overlaps with the creepage structure,
  wherein both the first electrically conductive interface layer and the second electrically conductive interface layer are arranged at the first package side,
  wherein
    the creepage structure is a groove that extends into a plane of the first package side and is spaced apart from every one of the package sidewalls that extend between the first package side and the second package side by a planar surface portion of the first package side,
    wherein the creepage structure vertically extends from the first package side to the second package side, and
    wherein the electrically conductive connector extends through a passage of the package body, the passage being formed by a section of the package body between a bottom of the creepage structure and the second package side.

2. The package of claim 1, wherein the first electrically conductive interface layer and the second electrically conductive interface layer have a common lateral extension range along a first lateral direction, wherein the creepage structure is arranged between the first and the second electrically conductive interface layers along a second lateral direction perpendicular to the first lateral direction, and wherein the creepage structure has a length along the first lateral direction amounting to at least the common lateral extension range.

3. The package of claim 2, wherein the minimum dimension is a width of the creepage structure along the second lateral direction, and wherein the creepage structure has the minimum dimension along the first lateral direction for a distance amounting to at least the common lateral extension range.

4. The package of claim 1, wherein the creepage structure has a total vertical dimension along a vertical direction amounting to at least the minimum dimension.

5. The package of claim 1, wherein the minimum dimension amounts to at least 0.25 mm, or to at least 0.5 mm, or to at least 1 mm, or to at least 1.5 mm.

6. The package of claim 1, wherein the electrically conductive connector comprises at least one of a bond wire, a ribbon and a clip, and wherein the electrically conductive connector has a diameter in the range of 10 µm to 1000 µm.

7. The package of claim 1, wherein the creepage structure has a surface characteristic different from a surface characteristic of a remaining portion of the outside housing.

8. The package of claim 1, wherein the second load terminals each comprise a respective chip backside metallization.

9. The package of claim 1, wherein the first load terminals comprise a respective chip frontside metallization, and wherein each chip frontside metallization is structured.

10. A method of forming a package, the method comprising:
  providing a package body with an outside housing comprising a first package side, a second package side and package sidewalls, the package sidewalls extending between the first package side and the second package side;
  arranging a first electrically conductive interface layer and a second electrically conductive interface layer spaced apart from each other at the outside housing;
  arranging a first power semiconductor chip and a second power semiconductor chip within the package body, wherein both the first power semiconductor chip and the second power semiconductor chip each have a respective first load terminal and a respective second load terminal, wherein the first load terminals are electrically connected to each other within the package body, wherein the second load terminal of the first power semiconductor chip is electrically connected to the first electrically conductive interface layer, wherein the second load terminal of the second power semiconductor chip is electrically connected to the second electrically conductive interface layer; and
  forming, at the outside housing of the package body, a creepage structure having a minimum dimension between the first electrically conductive interface layer and the second electrically conductive interface layer, wherein both the first electrically conductive interface layer and the second electrically conductive interface layer are arranged at the first package side, wherein either:

the creepage structure is a protrusion that extends out from a plane of the first package side, or the creepage structure is a groove that extends into a plane of the first package side and is spaced apart from every one of the package sidewalls that extend between the first package side and the second package side by a planar surface portion of the first package side, and wherein forming the creepage structure comprises any one of: an etch processing step, a saw processing step, a mill processing step, or a laser processing step.

11. A package, comprising:

a package body with an outside housing comprising a first package side, a second package side and package sidewalls, the package sidewalls extending between the first package side and the second package side;

a first electrically conductive interface layer and a second electrically conductive interface layer spaced apart from each other at the outside housing;

a first power semiconductor chip and a second power semiconductor chip arranged within the package body, wherein the first chip and the second chip each have a respective first load terminal and a respective second load terminal, wherein the first load terminals are electrically connected to each other within the package body, wherein the second load terminal of the first power semiconductor chip is electrically connected to the first electrically conductive interface layer, wherein the second load terminal of the second power semiconductor chip is electrically connected to the second electrically conductive interface layer, wherein the outside housing of the package body further comprises a creepage structure having a minimum dimension between the first electrically conductive interface layer and the second electrically conductive interface layer, wherein both the first electrically conductive interface layer and the second electrically conductive interface layer are arranged at the first package side, wherein the creepage structure is a groove that extends into a plane of the first package side and is spaced apart from every one of the package sidewalls that extend between the first package side and the second package side by a planar surface portion of the first package side, and wherein the groove has any one of: a substantially trapezoidal cross-section, a substantially T-like cross-section, and a substantially rectangular cross-section.

* * * * *